(12) United States Patent  
Chui

(10) Patent No.: US 9,151,799 B2  
(45) Date of Patent: *Oct. 6, 2015

(54) FINE PITCH INTERFACE FOR PROBE CARD

(71) Applicant: Corad Technology Inc., Santa Clara, CA (US)

(72) Inventor: Ka Ng Chui, Menlo Park, CA (US)

(73) Assignee: Corad Technology Inc., Santa Clara, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 13/707,966

(22) Filed: Dec. 7, 2012

(65) Prior Publication Data

US 2014/0091825 A1    Apr. 3, 2014

Related U.S. Application Data

(63) Continuation-in-part of application No. 13/644,162, filed on Oct. 3, 2012, now abandoned.

(51) Int. Cl.
  *G01R 31/00* (2006.01)
  *G01R 31/28* (2006.01)
  *G01R 1/073* (2006.01)

(52) U.S. Cl.
  CPC ........ *G01R 31/2889* (2013.01); *G01R 1/07364* (2013.01)

(58) Field of Classification Search
  CPC ........... G01R 31/2889; G01R 1/07364; G01R 1/07378
  USPC .............. 324/755.01–756.07, 754.01–754.31
  See application file for complete search history.

(56) References Cited

U.S. PATENT DOCUMENTS

| 5,412,329 | A | 5/1995 | Lino et al. |
|---|---|---|---|
| 7,138,812 | B2 * | 11/2006 | Park et al. ................ 324/754.07 |
| 7,252,514 | B2 * | 8/2007 | McKnight et al. .............. 439/66 |
| 7,279,911 | B2 * | 10/2007 | Tunaboylu et al. ...... 324/756.03 |
| 7,368,928 | B2 * | 5/2008 | Lin et al. .................. 324/756.03 |
| 2002/0190738 | A1 * | 12/2002 | Beaman et al. ............... 324/754 |
| 2003/0094962 | A1 | 5/2003 | Rincon et al. |
| 2003/0146770 | A1 | 8/2003 | Ivanov |
| 2004/0021475 | A1 | 2/2004 | Ito et al. |
| 2004/0124829 | A1 | 7/2004 | Swettlen |
| 2004/0257098 | A1 * | 12/2004 | Satou et al. ................... 324/754 |

(Continued)

OTHER PUBLICATIONS

Non-Final Office Action for U.S. Appl. No. 13/815,134, dated Jun. 5, 2014, 9 pages.

(Continued)

*Primary Examiner* — Arleen M Vazquez  
*Assistant Examiner* — Lee Rodak  
(74) *Attorney, Agent, or Firm* — Mahamedi Paradice LLP

(57) ABSTRACT

A probe card interface for interfacing a probe head with a first circuit. The probe card interface includes an impedance control element to interface a first set of pins of the probe head with the first circuit. The impedance control element is further configured to control the impedance of the first set of pins. The probe card interface includes a conductive plane to interface a second set of pins of the probe head with the first circuit. The conductive plane is further coupled to provide at least one of power or ground to the second set of pins.

7 Claims, 9 Drawing Sheets

(56) References Cited

U.S. PATENT DOCUMENTS

| | | | |
|---|---|---|---|
| 2005/0035775 A1 | 2/2005 | Zhou et al. | |
| 2005/0253604 A1 | 11/2005 | Hsu et al. | |
| 2009/0315577 A1* | 12/2009 | Ni | 324/754 |
| 2010/0307801 A1* | 12/2010 | Kim et al. | 174/257 |
| 2011/0074455 A1* | 3/2011 | Nakata et al. | 324/754.03 |

OTHER PUBLICATIONS

Non-Final Office Action for U.S. Appl. No. 13/935,112, dated Nov. 24, 2014, 22 pages.

Final Office Action for U.S. Appl. No. 13/644,162, dated Oct. 9, 2014, 25 pages.

\* cited by examiner

FINE PITCH INTERFACE FOR PROBE CARD

RELATED APPLICATIONS

This Application is a continuation-in-part of U.S. patent application Ser. No. 13/644,162, entitled "FINE PITCH INTERFACE FOR PROBE CARD," filed on Oct. 3, 2012; the aforementioned priority application being hereby incorporated by reference in its entirety.

TECHNICAL FIELD

The present invention relates generally integrated circuit technology and specifically to probe cards used to test integrated circuit devices.

BACKGROUND OF RELATED ART

Probe cards are typically used in the testing of integrated circuit (IC) devices. Due to their design, probe cards are particularly advantageous for testing entire semiconductor wafers to detect any manufacturing defects before they are diced and packaged. For example, a probe card is typically formed from a printed circuit board (PCB) having a number of electrical contact elements and/or traces disposed thereon to connect to a testing apparatus. The PCB is connected to a probe head having a number of pins that are brought into contact with a device under test (DUT) to facilitate the transmission of electrical signals to and from the DUT. Accordingly, the probe card acts as an interface between the testing apparatus and the DUT.

Because the probe head serves as the primary interface with the DUT, the pitch (i.e., spacing between the pins) of the probe head must be very small in order to properly align with corresponding contact pads of the DUT. On the other hand, the electrical traces on the PCB are generally coarser and spaced further apart to be more easily connected to the testing apparatus (e.g., automatic test equipment or "ATE"). Accordingly, many probe cards additionally include a space transformer disposed between the PCB and the probe head to interface the pins of the probe head with the electrical traces on the PCB. A typical space transformer is made of a multilayer ceramic material having a plurality of transmission paths formed therein to connect the probe head to the PCB. Such space transformers can be very expensive to produce. In contrast, a low-cost space transformer is made up of a number of wires that form the transmission paths connecting the probe head to the PCB. However, the lengths of the transmission paths can have many adverse effects on the signals communicated to and from the DUT. For example, in high frequency signaling (where a switching edge of an electrical signal is short relative to the length of the transmission path), any slight discontinuities in impedance along the length of the transmission path will create reflections, thus causing the transmitted signal to become distorted. In addition, most IC devices must be powered (e.g., by receiving a power signal) in order to function. However, because longer ground paths also have greater inductances, a long power path will radiate and be more susceptible to external noise and interference.

As die sizes continue to shrink, so too does the pitch of the contact pads of IC devices. Accordingly, there is a need for a probe card that can be used in the testing of such fine pitch IC devices. More specifically, there is a need for a low cost means of interfacing the pins of a fine pitch probe head with corresponding contacts on a PCB, without sacrificing signal quality or efficiency.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

A fine pitch interface for probe cards is disclosed. In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements may be shown as buses or as single signal lines. Each of the buses may alternatively be a single signal line, and each of the single signal lines may alternatively be a bus. The terms, "electrical contacts" and "electrical traces" may be used herein interchangeably. Accordingly, the present invention is not to be construed as limited to specific examples described herein but rather includes within its scope all embodiments defined by the appended claims.

Present embodiments provide a low-cost probe card interface having means for interfacing the pins of a probe head with corresponding contacts on a circuit board without sacrificing signal quality or efficiency. In specific embodiments, the fine pitch interface includes an impedance control component that can be configured to control the impedance of one or more signal pins of the probe head. By controlling the impedance of the signal pins, the impedance control component can reduce signal distortion along the transmission path between the circuit board and the probe head. Other embodiments provide for a fine pitch interface having a power/ground component that can be coupled to an external power supply to efficiently deliver power to a device under test. The power/ground component effectively "extends" the external power supply by bringing it closer to the probe head so that the transmission path between the external power supply and the device under test is more resistant to the undesirable effects of inductance and noise.

Figure 1:
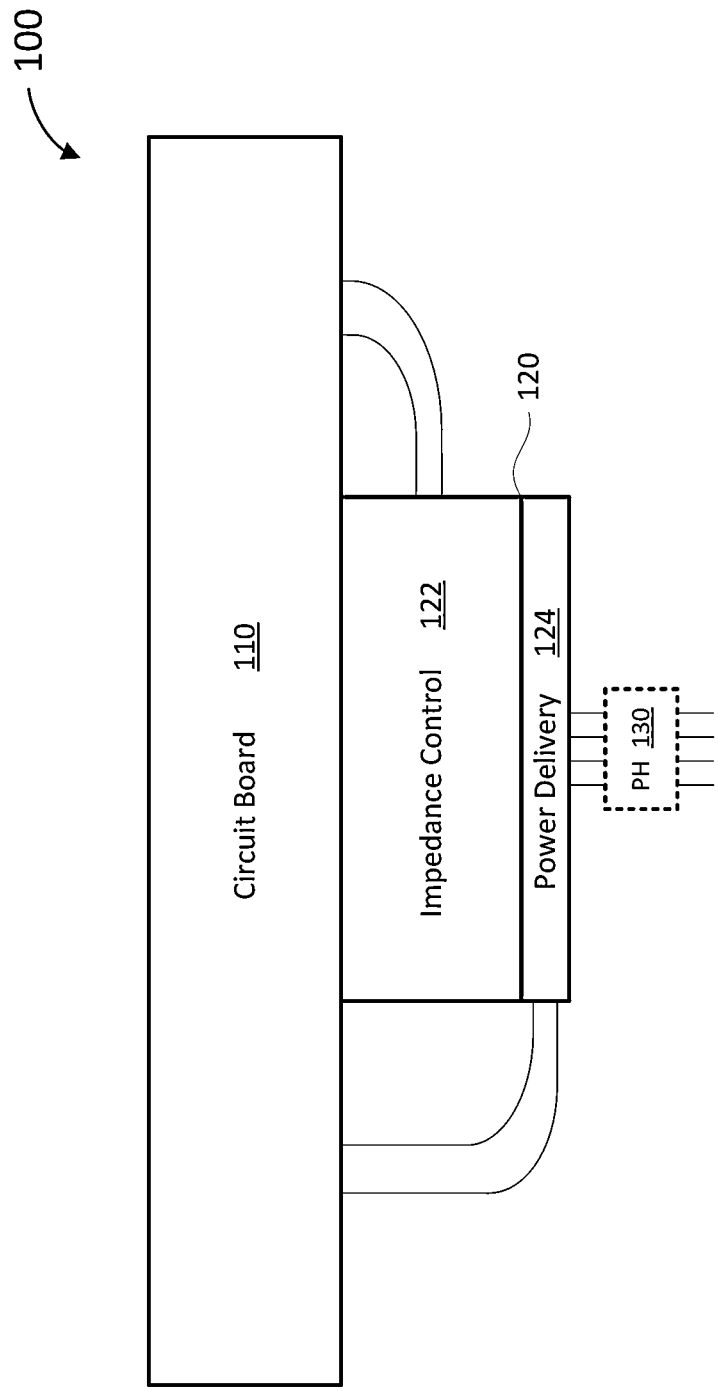
FIG. 1 illustrates a fine pitch probe card interface, according to an embodiment.

FIG. 1 illustrates a fine pitch probe card interface, according to an embodiment. The probe card 100 includes a circuit board 110, a fine pitch interface 120, and a probe head 130. The circuit board 110 may be a printed circuit board (PCB) with a number of electrical contacts or traces disposed thereon. When the probe card 100 is used in the testing of an IC device, a testing apparatus (e.g., automatic test equipment or "ATE") is connected to one or more electrical traces on the circuit board 110 to communicate data signals and/or power/ground to a device under test (DUT). The probe head 130 includes a number of pins designed to make electrical contact with one or more contact pads of the DUT. The fine pitch interface 120 interfaces the probe head 130 with the circuit board 110 and facilitates the transmission of data signals and/or power/ground between the testing apparatus and the DUT. For example, one or more of the pins in the probe head 130 may correspond to conductive wires that are directly connected to the traces on the circuit board 110. The fine pitch interface may be configured to "space out" the wires leading from the probe head 130 so that they align properly with the traces on the circuit board 110.

According to an embodiment, the fine pitch interface includes an impedance control component 122 to control an impedance of one or more transmission paths from the circuit board 110 to the probe head 130. As a result, the impedance control component 122 may reduce reflections along the transmission path between the circuit board 110 and the probe head 130, thus improving the signal quality of one or more transmitted signals. As will be discussed in greater detail below, the impedance control component 122 may include a dielectric material sandwiched between two ground plates. One or more conductors connecting the probe head 130 to the circuit board 110 may then be at least partially disposed within the dielectric material. The impedance of the transmission paths between the probe head 130 and the circuit board 110 may thus be controlled based, at least in part, on the properties (e.g., dielectric constant) of the dielectric material.

According to another embodiment, the fine pitch interface 120 includes a power/ground component 124 to serve as an extended power source for supplying power to the DUT, and providing a return path for the power source. The power/ground component 124 may be coupled, via the circuit board 110, to receive (and return) a power signal from an external power source (e.g., the testing apparatus) to the DUT. The power/ground component 124 is arranged in close proximity to the probe head 130 so that one or more pins, used for delivering power to the DUT, can be connected to the power/ground component 124 via relatively short transmission paths. This reduces the overall inductances and noise of one or more transmission paths supplying power to the DUT and their corresponding return paths. As will be discussed in greater detail below, the power/ground component 124 may include both a power plane and a ground plane. More specifically, the power/ground component 124 may be formed from one or more flex PCB materials, wherein one or more pins of the probe head 130 are connected to the power/ground component 124 using copper-filled vias.

Although the embodiments described above have been presented in the context of a single integrated fine pitch interface 120 they are not so limited. Thus, in some embodiments, the fine pitch interface 120 may include only the impedance control component 122. In other embodiments, the fine pitch interface 120 may include only the power/ground component 124. In yet another embodiment, the fine pitch interface 120 may be integrally formed with the circuit board 110.

Figure 2:
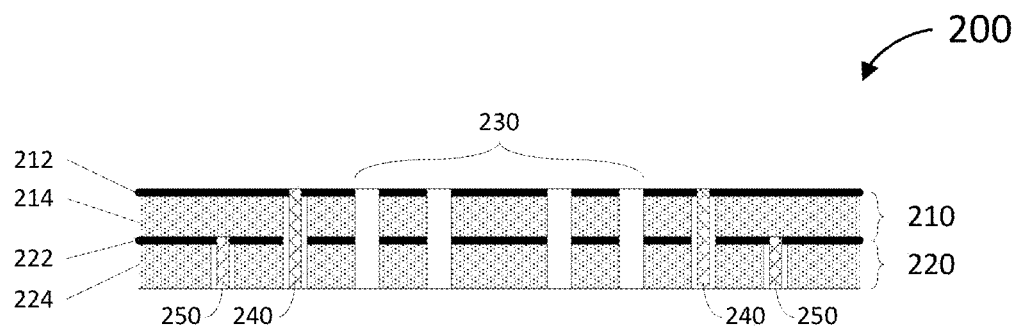
FIG. 2 shows a detailed embodiment of a power/ground component of the fine pitch interface shown in FIG. 1.

FIG. 2 shows a detailed embodiment of a power/ground component of the probe card 100, as shown in FIG. 1. The power/ground component 200 includes a ground plane 210 and a power plane 220. The ground plane 210 includes a conductive layer 212 disposed on top of a flexible (e.g., polyimide) substrate 214. Similarly, the power plane 220 includes a conductive layer 222 also disposed on top of a flexible substrate 224. According to an embodiment, each of the ground plane 210 and the power plane 220 is formed from a flex PCB material. As will be described in greater detail below, the flexibility of the power plane 220 (and the ground plane 210) allows it to be easily connected to a power supply and/or the circuit board 110, shown in FIG. 1, to enable the power plane 220 to be charged to supply power to a DUT.

A set of vias 230 are formed in the power/ground component 200 to facilitate one or more connections or transmission paths between the circuit board 110 and the probe head 130 and/or DUT. According to an embodiment, one or more wires are disposed in the set of vias 230 to connect the probe head 130 to the circuit board 110.

A set of copper-filled vias 240 connects the ground plane 210 to the probe head 130, and another set of copper-filled vias 250 connects the power plane 220 to the probe head 130. According to an embodiment, the copper-filled vias 240 and 250 are connected to corresponding pins in the probe head 130 that are used to provide ground and power to one or more DUTs. Alternatively, the copper-filled vias 240 and 250 may extend beyond the bottom surface of the power/ground component 200 to have contact with the pins of the probe head 130. Note that, although specific reference is made to "copper-filled vias," the copper-filled vias 240 and 250 may be filled with any type of conductive material.

Because the ground plane 210 and power plane 220 are thin and in close proximity to the probe head 130, the copper-filled vias 240 and 250 can be relatively short in length. More specifically, the transmission path from the ground plane 210 to the probe head 130 is much shorter, and therefore has a much lower inductance, than in conventional space transformers. Accordingly, less noise is radiated and received when providing power to the DUT than would otherwise be lost in prior art embodiments.

Figure 3:
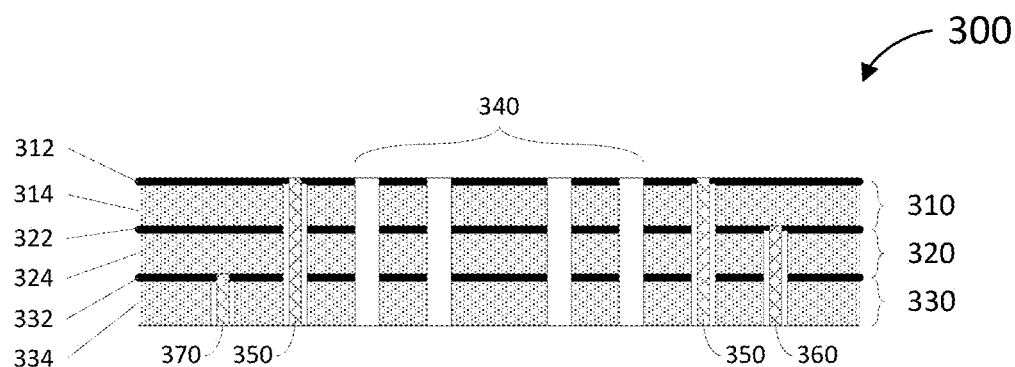
FIG. 3 shows another embodiment of a power/ground component of the fine pitch interface shown in FIG. 1.

FIG. 3 shows another embodiment of a power/ground component of the probe card 100 shown in FIG. 1. The power/ground component 300 includes a ground plane 310 and multiple power planes 320 and 330. The ground plane 310 includes a conductive layer 312 disposed on top of a flexible (e.g., polyimide) substrate 314. Each of the power planes (320 and 330) also includes a conductive layer (322 and 332) disposed on top of a flexible substrate (324 and 334). According to an embodiment, each of the ground plane 310 and the power planes 320 and 330 is formed from a flex PCB material.

A set of vias 340 are formed in the power/ground component 300 to facilitate one or more connections or transmission paths between the circuit board 110 and the probe head 130. According to an embodiment, one or more wires are disposed in the set of vias 340 to connect the probe head 130 to the circuit board 110.

A first set of copper-filled vias 350 connects the ground plane 310 to the probe head 130, a second set of copper-filled vias 360 connects the first power plane 320 to the probe head 130, and a third set of copper-filled vias 370 connects the second power plane 330 to the probe head 130. According to an embodiment, the copper-filled vias 350-370 are connected to corresponding pins in the probe head 130 that are used to provide ground and power to one or more DUTs. Alternatively, the copper-filled vias 350-370 may extend beyond the bottom surface of the power/ground component 300 to have contact with the pins of the probe head 130. Although specific reference is made to "copper-filled vias," the copper-filled vias 350-370 may be filled with any type of conductive material.

Because the ground plane 310 and power planes 320 and 330 are thin and in close proximity to the probe head 130, the copper-filled vias 350-370 can be relatively short in length. More specifically, due to its thinness, the power/ground component 300 is able to provide multiple power and data connections to a DUT, without sacrificing the integrity of any of the signals.

Figure 4:
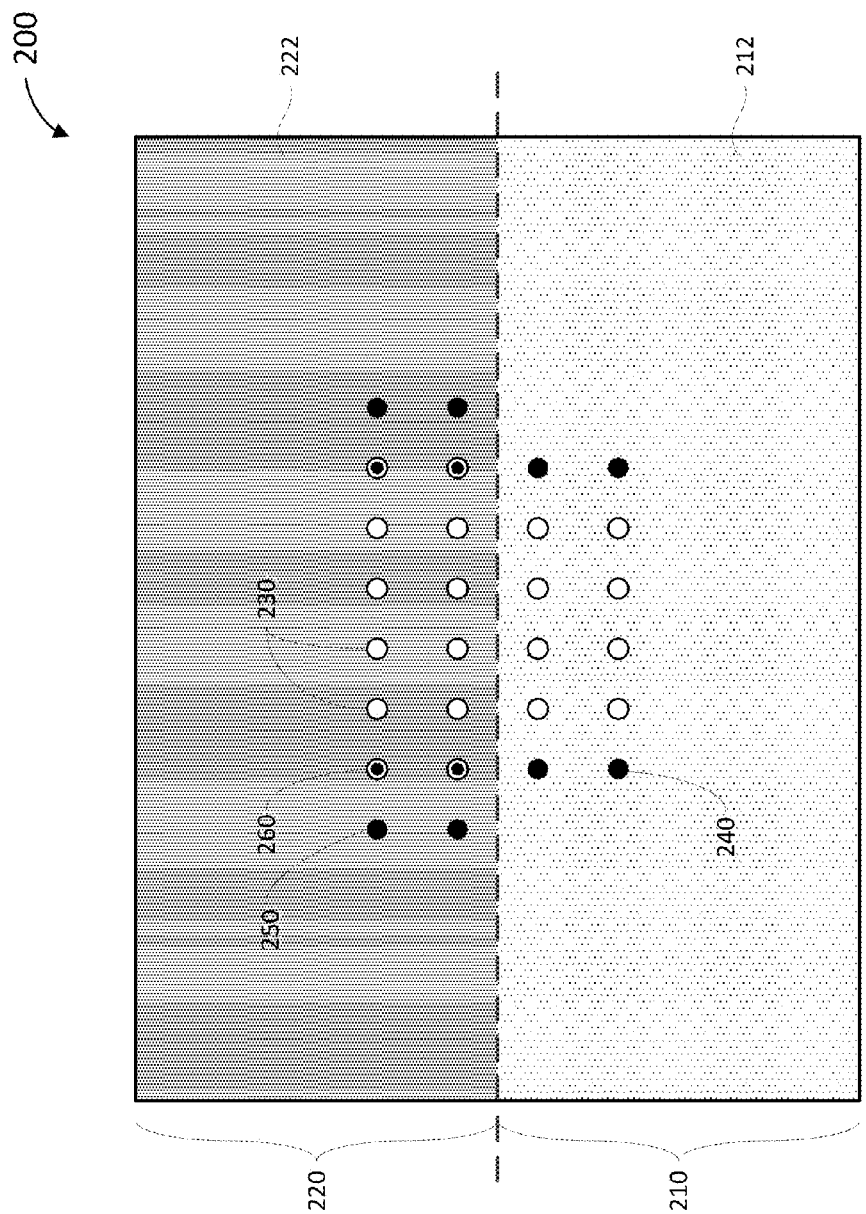
FIG. 4 shows a planar view of an embodiment of a power/ground component.

FIG. 4 shows a planar view of an embodiment of a power/ground component. More specifically, FIG. 4 is a cutaway illustration of the power/ground component 200, showing both the ground plane 210 and the power plane 220 underneath. In the embodiment shown, the conductive layers 212 and 222 have a relatively large conductive surface in comparison with the copper-filled vias 240 and 250. For some embodiments, the geometries of the conductive layers 212 and 222 are configured to promote heat dissipation in order to preserve power along the transmission path from a power source or testing apparatus to a DUT. Accordingly, the power/ground component 200 may act as an "extension" of the power source by effectively bringing the power source closer to the DUT.

A number of copper-filled vias 240 and 250 are connected to each of the power and ground planes 220 and 210, respectively. Each of the copper-filed vias 250 may be used to supply power to a DUT. Accordingly, each of the copper-filled vias 240 may provide a return/ground path for a respective DUT. The vias 230 of the power plane 220 are aligned with corresponding vias 230 of the ground plane 210 to provide an unobstructed transmission path for the transmission of test signals between the testing apparatus and the DUT. Similarly, the conductive layer 222 of the power plane 220 includes an additional set of vias 260 that align with the copper-filled vias 240 of the ground plane 210 to allow the copper-filled vias 240 to pass through the power plane 220 to be connected to a probe head and/or DUT.

Although the vias 230 and 260, and copper-filled vias 240 and 250, are configured in a grid-like arrangement, they may be arranged in various other configurations depending on the application.

Figure 5:
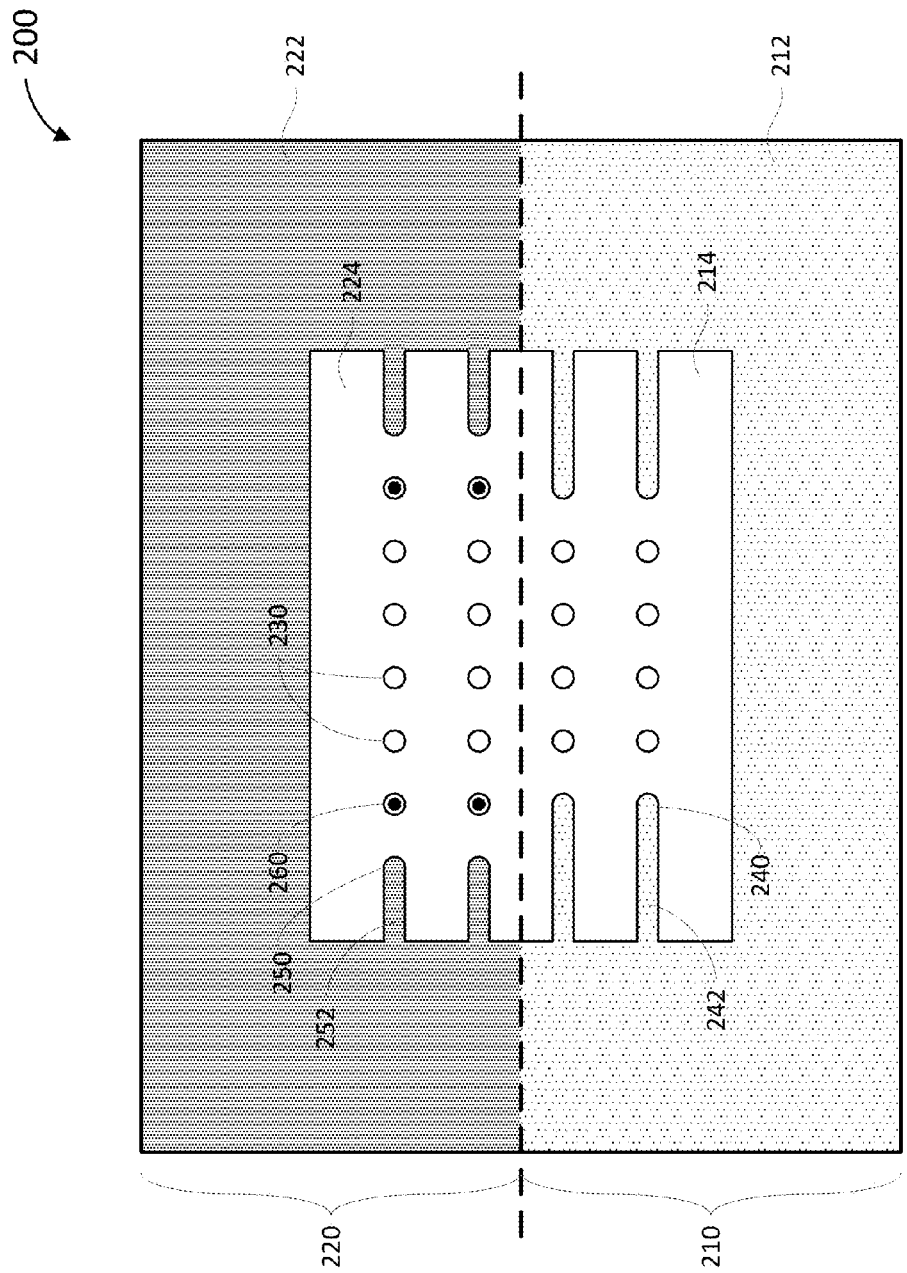
FIG. 5 shows a planar view of another embodiment of a power/ground component.

FIG. 5 shows a planar view of another embodiment of a power/ground component. In the embodiment shown, the conductive layers 212 and 222 are provided outside of the "probe pin area" (i.e., the area where the vias 230 and copper-filled vias 240 and 250 are disposed). For example, the portions of the conductive layers 212 and 222 inside the probe pin area may be etched away, thus exposing the flexible substrates 214 and 224, respectively. The copper filled vias 250 are coupled to the conductive layer 222 via conductive traces 252. Similarly, copper filled vias 240 are coupled to the conductive layer 212 via conductive traces 242. Since there are no conductive surfaces in close proximity of the vias 230, signals transmitted between the testing apparatus and the DUT are less susceptible to noise and interference. This allows for finer pitch between the vias 230 and corresponding signal lines disposed in the vias.

Figure 6:
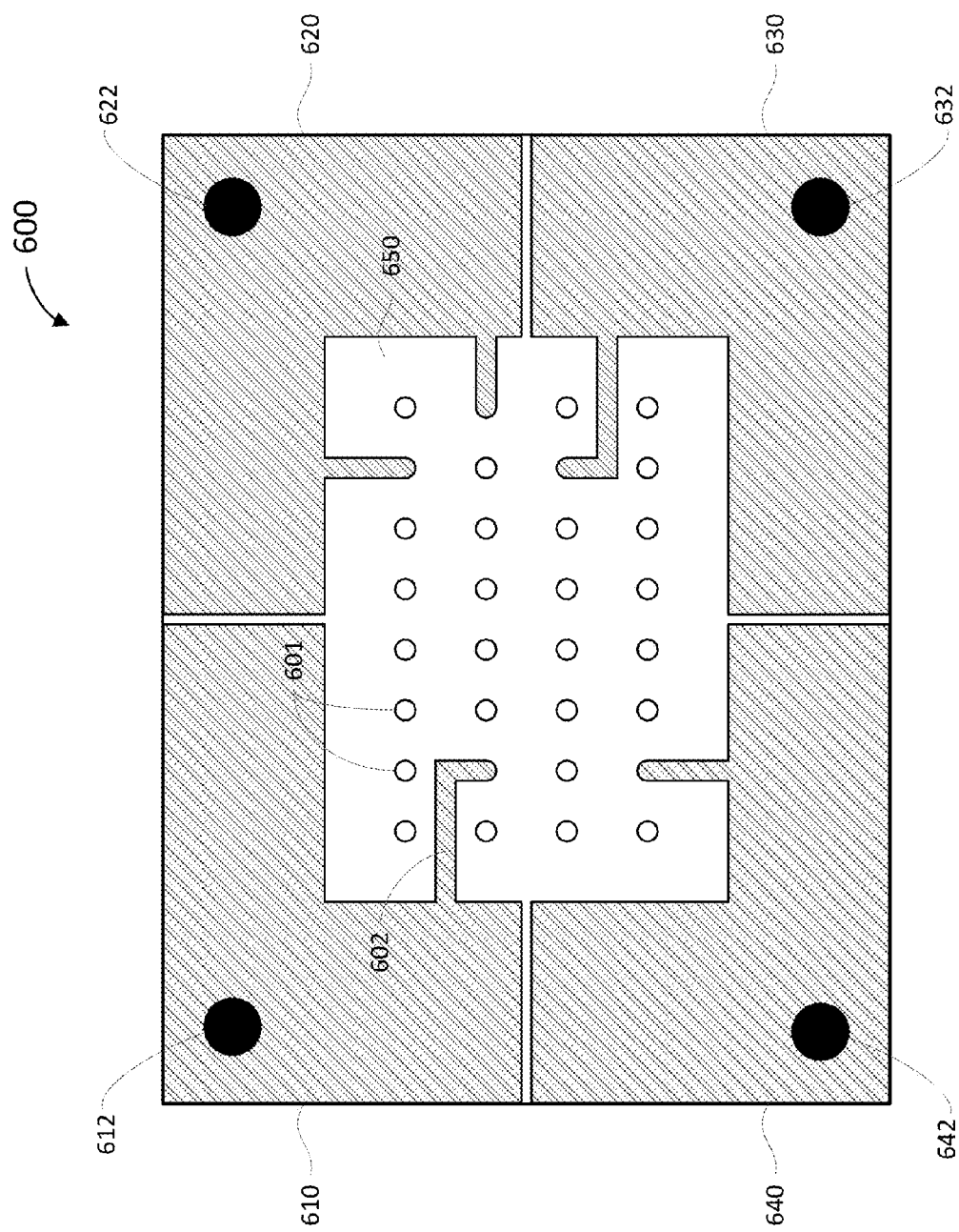
FIG. 6 shows a planar view of yet another embodiment of a power/ground component.

FIG. 6 shows a planar view of yet another embodiment of a power/ground component. In this embodiment, a single layer of conductive material is subdivided into multiple sections 610, 620, 630, and 640, such that each subsection can be configured to provide a separate power or ground signal to a DUT. As with the embodiment shown in FIG. 5, the conductive layer covering the probe pin area is etched away to expose the flexible substrate 650 underneath. Accordingly, conductive traces 602 can be used to connect the conductive subsections 610, 620, 630, and 640 to individual pins 601 within the probe pin area. For some embodiments, each conductive subsection 610, 620, 630, and 640 may be coupled to one or more power and/or ground planes (e.g., power plane 220 and/or ground plane 210) using one or more copper-filled vias 612, 622, 632, and 624. In other embodiments, each of the conductive subsections 610, 620, 630, and 640 can be directly coupled to an external power or ground source. Accordingly, the power/ground component 600 may provide the same noise-reduction advantages as the multilayered power/ground component 200, using just a single layer of conductive material (and flexible substrate).

Figure 7:
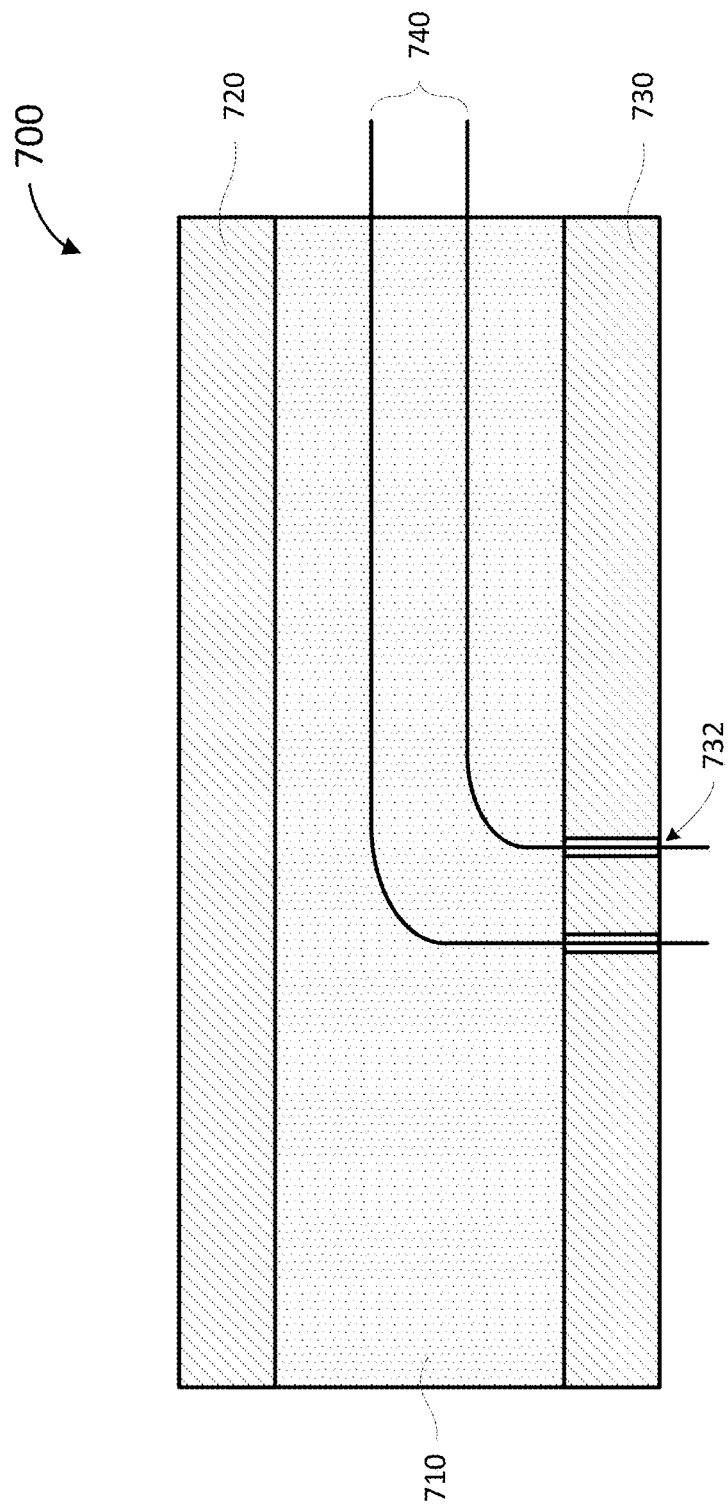
FIG. 7 shows a detailed embodiment of an impedance control component of the fine pitch interface shown in FIG. 1.

FIG. 7 shows a detailed embodiment of an impedance control component of the fine pitch interface shown in FIG. 1. The impedance control component 700 includes a dielectric substrate 710 disposed between two ground planes 720 and 730. One or more conductors 740 (note that only two conductors are shown here for simplicity) provide a transmission path for the transmission of test signals between a testing apparatus and a DUT. The one or more conductors 740 are at least partially disposed in the dielectric material 710 so that the dielectric properties of the dielectric material 710 can be used to control the impedance of the transmission path of the conductors 740 (e.g., based on the dielectric constant $\in_0$ of the dielectric material).

In some embodiments, the ground planes 720 and 730 are formed from a ceramic material. The ground plane 720 may attach to the circuit board of a probe card (e.g., circuit board 110 of FIG. 1). For example, the ground plane 720 may be connected to the ground of the circuit board. The lower ground plane 730 includes one or more vias 732 to allow the conductors 740 to be connected to a probe head and/or DUT. For some embodiments the vias 732 of the ground plane 730 may be aligned with corresponding vias of a power/ground component (e.g., vias 230 of FIGS. 2 and 4A-4B). Furthermore, the conductors 740 may be conductive wires that connect the circuit board 110 to the probe head 130.

By controlling the impedance of the conductors 740, the impedance control component 700 may reduce reflections along the transmission path between the testing apparatus and the DUT. This, in turn, improves the signal quality of transmitted test signals.

Figure 8:
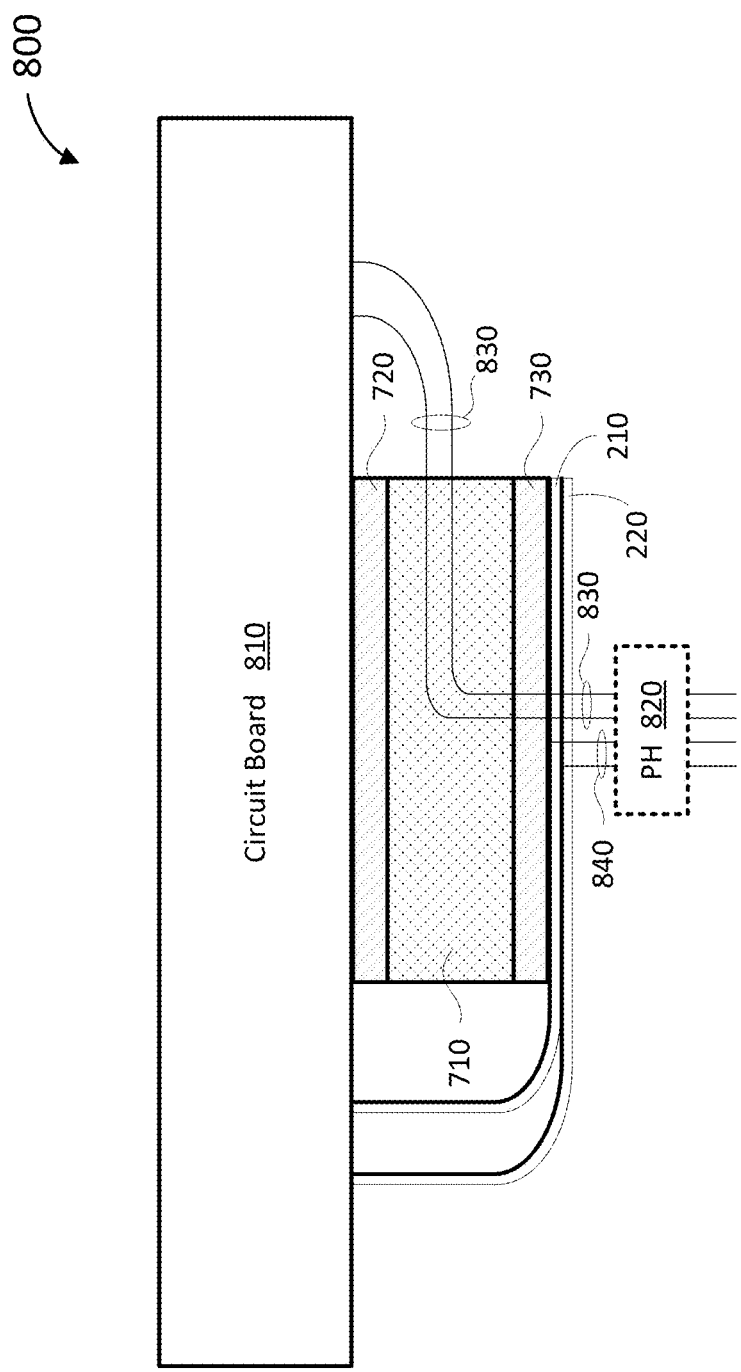
FIG. 8 shows a more detailed embodiment of a fine pitch probe card interface.

FIG. 8 shows a more detailed embodiment of a fine pitch probe card interface. The probe card 800 includes a circuit board 810, dielectric substrate 710, ground planes 720 and 730, flexible ground plane 210, flexible power plane 220, and a probe head 820. The dielectric substrate 710 and ground planes 720 and 730 are described above in greater detail with respect to FIG. 7. The flexible ground plane 210 and the flexible power plane 220 are described above in greater detail with respect to FIGS. 2-4.

A set of conductors 830 form a set of transmission paths between the circuit board 810 and the probe head 820. The conductors 830 are at least partially disposed in the dielectric material 710, such that the dielectric properties of the dielectric material 710 can be used to control the impedance of the conductors 830. The conductors 830 may be, for example, copper, tungsten, or gold-plated wires. For simplicity, only two conductors 830 are shown in FIG. 8. In other embodiments, however, the set of conductors 830 may include fewer or more conductors than those shown.

A set of copper-filled vias 840 are connected to the flexible ground and power planes 210 and 220. More specifically, the flexible ground plane 210 and the flexible power plane 220 may be directly connected to the circuit board 810 to receive and return power and ground from a testing apparatus or external power source connected to the circuit board 810, thereby extending the external power and ground sources to be closer to the probe head 820. This allows the copper-filled vias 840 connecting the flexible ground and power planes 210 and 220 to the probe head 820 to be shorter in length, and thus have a lower inductance and greater resistance to external noise and interference. For simplicity, only one ground plane 210 and one power plane 220 are shown in FIG. 8. In other embodiments, however, the probe card 800 may include fewer or more ground and/or power planes.

In some embodiments, the set of conductors 830 are connected to corresponding pins of the probe head 820. In other embodiments, the conductors 830 may collectively form the pins of the probe head 820. Additionally, in some embodiments, the impedance control component 700 and power/ground component 200 may be integrally formed with the circuit board 810.

Figure 9A:
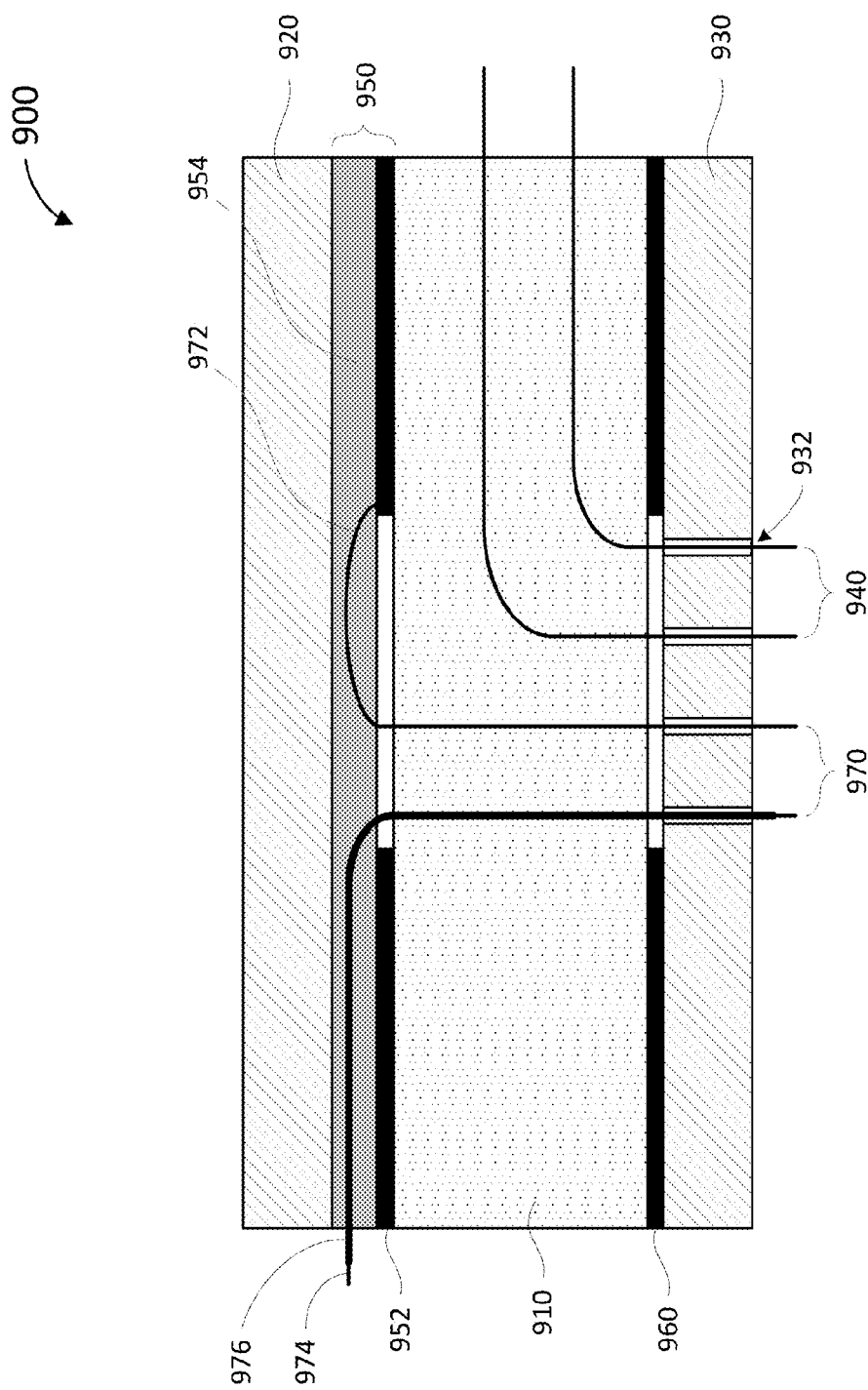
FIGS. 9A and 9B show another embodiment of a fine pitch probe card interface.

FIG. 9A shows another embodiment of a fine pitch probe card interface. The probe card interface 900 includes a dielectric substrate 910, support layers 920 and 930, and conductive layers 950 and 960. A first set of conductors 940 form a set of transmission paths between a circuit board and a probe head (not shown, for simplicity). The conductors 940 are at least partially disposed in the dielectric material 910, such that the dielectric properties of the dielectric material 910 can be used to control the impedance of the conductors 940 (e.g., as described above in reference to FIG. 7). The conductors 940 may be, for example, copper, tungsten, or gold-plated wires. Although only two conductors 940 are shown for simplicity, other embodiments may include fewer or more conductors than those shown.

Figure 9B:
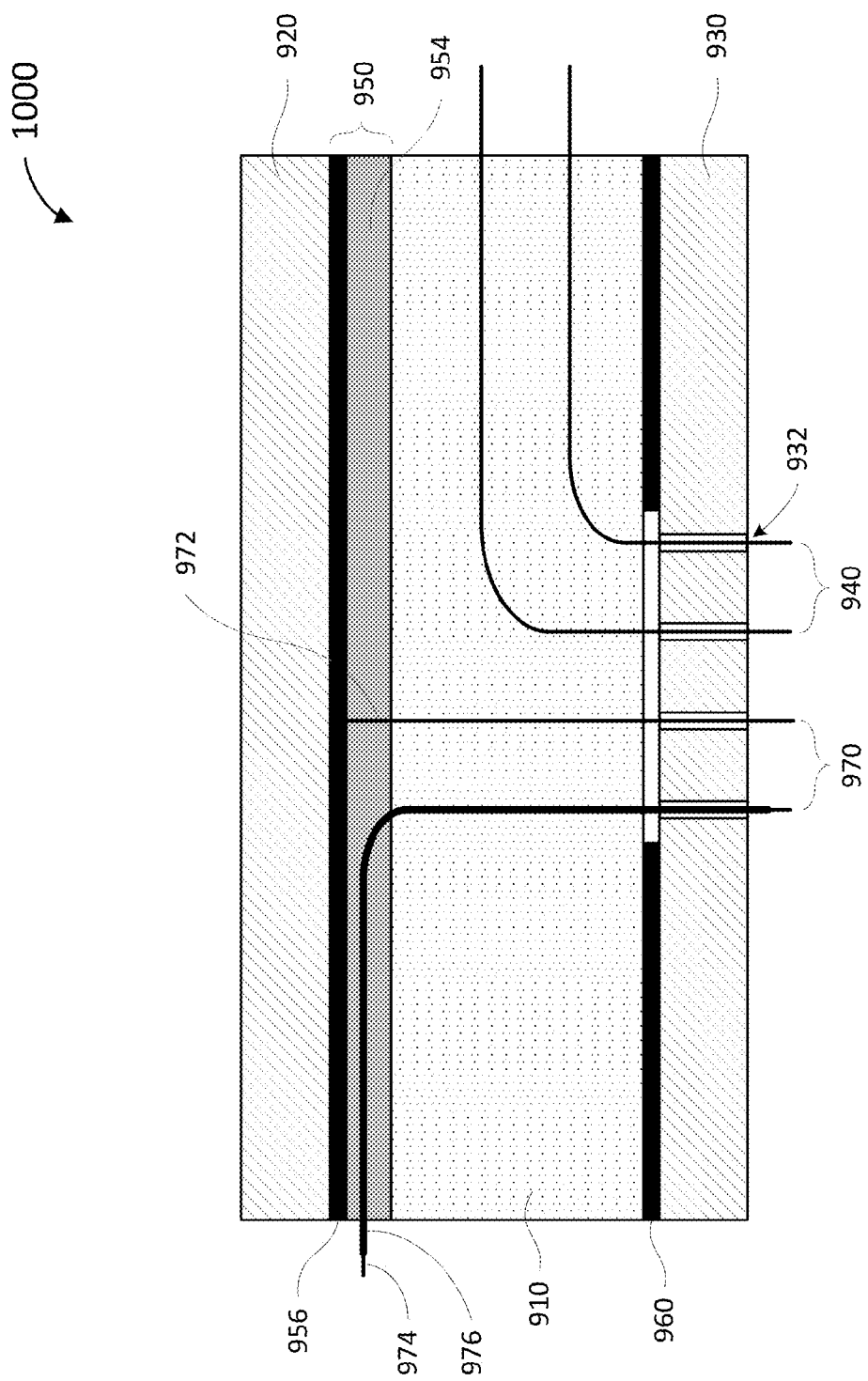

A second set of conductors 970 are disposed (at least in part) in the conductive layer 950. More specifically, the conductive layer 950 may include a metal layer 952 and a layer of conductive adhesive 954. For example, the conductive adhesive 954 may be formed around the second set of conductors 970 to interface the second set of conductors 970 with a circuit board. The conductive layer 950 may be connected to a ground (or power) terminal of a circuit board, thereby extending the ground (or power) source closer to the probe head. Alternatively, the conductive layer 950 may be directly connected to a ground (or power) terminal external to the circuit board. For some embodiments, the conductive adhesive 954 is formed between the metal layer 952 (which is adjacent to the dielectric substrate 910) and the upper support layer 920. Accordingly, the metal layer 952 may include an opening in the center for the second set of conductors 970 to pass through. In other embodiments, the conductive adhesive 954 is formed directly above the dielectric substrate 910. For example, in reference to the probe card interface 1000 of FIG. 9B, the layer of conductive adhesive 954 is formed between the metal layer 956 (which is adjacent to the upper support layer 920) and the dielectric substrate 910. The second set of conductors 970 includes at least two conductive wires 972 and 974. For some embodiments, one end the first conductive wire 972 is connected to the metal layer 952 (and/or simply embedded in the conductive adhesive 954). The second conductive wire 974 extends through the conductive adhesive 954 and connects to a power (or ground) terminal on a circuit board. For some embodiments, the second conductive wire 974 includes an outer shield 976 to insulate the inner conductor from the conductive layer 950.

The support layers 920 and 930 provide structural support for the probe car interface 900. For some embodiments, the support layers 920 and 930 are formed from a ceramic material. The conductive layer 960 includes an opening in the center for the conductors 940 and 970 to pass through. Furthermore, the lower support layer 930 includes one or more vias 932 to interface the ends of the conductors 940 and 970 with a probe head. Specifically, the vias 932 may be configured to align the conductors 940 and 970 with the geometry or pin configuration of the probe head.

The probe card interface 900 may provide similar advantages as the probe card interface described above in reference to FIG. 8. For example, the dielectric layer 910 may be used to perform impedance-control functions (e.g., as described with respect to FIG. 7), while the conductive layer 950 may help lower the inductance of probe head pins which provide power and/or ground (e.g., as described with respect to FIGS. 2-6).

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A probe card interface comprising:
an impedance control element to connect a first set of pins of a probe head with a first circuit, wherein the impedance control element is configured to control the impedance of the first set of pins, and wherein the impedance control element includes a dielectric substrate;
a conductive plane to connect a second set of pins of the probe head with the first circuit, wherein the conductive plane is coupled to at least one of a power source or ground, and includes a metal layer and a layer of conductive adhesive material;
a first set of conductors embedded, at least in part, within the dielectric substrate to connect the first set of pins to the first circuit; and
a second set of conductors embedded, at least in part, within the dielectric substrate and within the conductive adhesive material to provide at least one of power or ground to the second set of pins.

2. The probe card interface of claim 1, wherein the dielectric substrate is coupled between two ground planes.

3. The probe card interface of claim 2, wherein one or more of the pins of the first set of pins comprises a conductive wire.

4. The probe card interface of claim 1, wherein the conductive plane is coupled to ground.

5. The probe card interface of claim 4, wherein the second set of pins includes at least a power pin and a ground pin.

6. The probe card interface of claim 5, wherein the ground pin is coupled to the conductive plane via a conductive wire of the second set of conductors.

7. The probe card interface of claim 6, wherein the power pin is coupled to a power source on the first circuit via a shielded wire of the second set of conductors.

* * * * *